United States Patent [19]

Roche et al.

[11] Patent Number: 4,530,152
[45] Date of Patent: Jul. 23, 1985

[54] METHOD FOR ENCAPSULATING SEMICONDUCTOR COMPONENTS USING TEMPORARY SUBSTRATES

[75] Inventors: Georges Roche, Chatillon Sous Bagneux; Jacques Lantaires, Verrieres Le Buisson, both of France

[73] Assignee: Compagnie Industrielle des Telecommunications CIT-ALCATEL, Paris, France

[21] Appl. No.: 481,523

[22] Filed: Apr. 1, 1983

[30] Foreign Application Priority Data

Apr. 1, 1982 [FR] France ............................. 82 05624

[51] Int. Cl.³ ..................... H01L 21/92; H01L 21/56; H01L 21/58
[52] U.S. Cl. ...................................... 29;588; 29/576 S; 29/590; 29/591; 148/DIG. 135; 156/155; 156/280; 156/300; 357/68; 357/71; 357/72
[58] Field of Search ...................... 29/576 S, 588, 589, 29/590, 591; 148/DIG. 135; 357/68, 71, 72; 156/155, 280, 300; 427/89, 90

[56] References Cited

U.S. PATENT DOCUMENTS 3,689,336 9/1972 Bunker et al. .................. 156/155 X
3,739,462 6/1973 Hasty ..................................... 29/577

Primary Examiner—Brian E. Hearn
Assistant Examiner—Alan E. Schiavelli
Attorney, Agent, or Firm—Sughrue, Mion, Zinn, Macpeak, and Seas

[57] ABSTRACT

In the manufacture of a semiconductor component, connection areas adapted to connect the component externally are formed by a metal array (3, 4) deposited on a conductive layer (6) of low melting point alloy, itself deposited on a metal temporary substrate (7). Each component chip (1) is placed in position and connected and then immobilized by means of a hardenable resin (5). The temporary substrate (7) is then removed by melting the alloy layer (6) to expose the surfaces of the connection areas (3, 4) for making external electrical and/or thermal connections to the encapsulated component.

8 Claims, 5 Drawing Figures

METHOD FOR ENCAPSULATING SEMICONDUCTOR COMPONENTS USING TEMPORARY SUBSTRATES

BACKGROUND OF THE INVENTION

1. Field of the Invention

The object of the present invention is a method of encapsulating semiconductor components, especially highly complex components, and the resulting encapsulated components themselves.

2. Description of the Prior Art

The encapsulation of highly complex semiconductor components is an important factor in the manufacture of integrated circuits, to the extent that the techniques utilized are often costly, especially in the case insufficiently large production runs. This is the case, for example, with the TAB method of mounting chips on support film.

The main problem which arises is the making of external connections to the integrated circuits, in that one aim is to increase the possible number of connections while another is to reduce the size of the final component to the greatest possible extent. It is these essential external connections which take up most space, since there is no technology in existence for reducing these to the size of those utilized within the integrated circuits they serve.

If the chips are soldered to a metal connecting array formed from metal film, the mechanical stresses which the array must withstand before soldering limit the extent to which the dimensions of the connecting leads may be reduced.

On the other hand, while it is possible to form a connecting array of very small dimensions on a substrate, using the various techniques commonplace in microelectronics, such as selective deposition through a mask, additive photolithography or possibly subtractive photolithography if the substrate is first coated with a layer of metal, there is no technique available for separating the connecting array from the insulating substrate carrying it, so that it is not possible to use the resulting connection array unless the connections are placed on the same side as the chip, which is not the intended aim.

The object of the present invention is thus a method of encapsulating semiconductor components, and especially highly complex components, which provides for the production of encapsulated components having a connecting array of very small dimensions.

SUMMARY OF THE INVENTION

In one aspect, the present invention consists in a method of encapsulating semiconductor components wherein connection areas adapted to connect each component externally are formed by a metal array deposited on a conductive layer of low melting point alloy itself deposited on a metal temporary substrate, each component chip is placed in position and connected and then immobilized by means of a hardenable resin, the resin is hardened, and the alloy layer is melted to permit removal of the temporary substrate and expose the surfaces of the connection areas for making external electrical and/or thermal connections to the encapsulated components.

In another aspect, the present invention consists in an encapsulated semiconductor component comprising at least one chip immobilized in hardened resin together with wires connecting it to metal coplanar connection areas whereby it is externally connected, and a temporary protective metal substrate joined to the metal coplanar connection areas by a layer of low melting point alloy which is melted to remove the temporary substrate and expose the surfaces of the connection areas for making external electrical and/or thermal connections to the component.

Other objects and advantages will appear from the following description of an example of the invention, when considered in connection with the accompanying drawings, and the novel features will be particularly pointed out in the appended claims.

DESCRIPTION OF THE PREFERRED EMBODIMENTS

Figure 1:
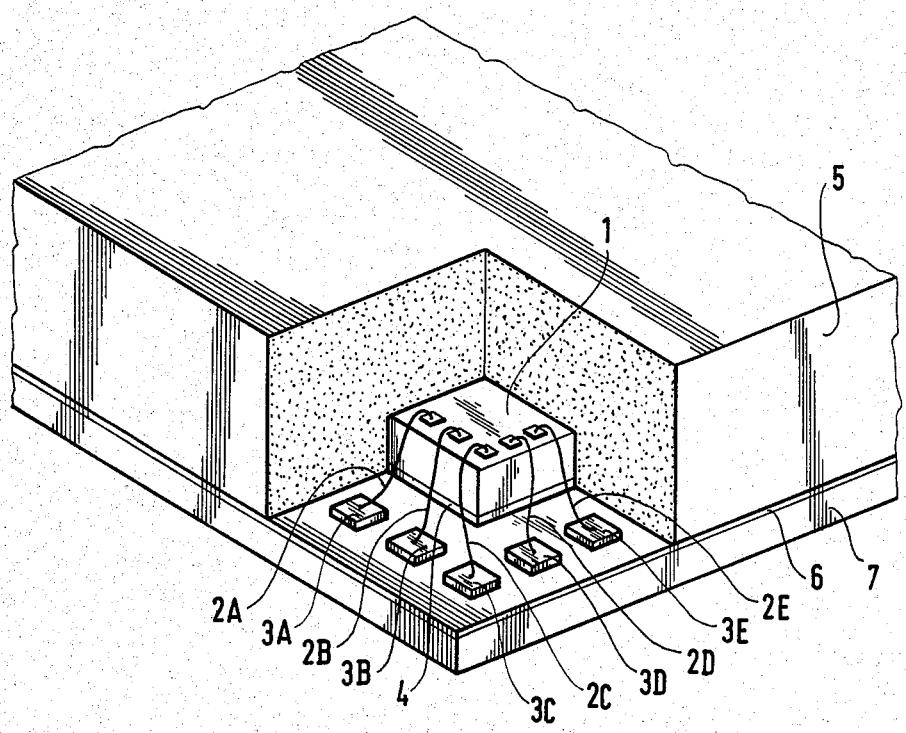
FIG. 1 is a partially cutaway view of a component manufactured in accordance with the invention.

The semiconductor component shown in FIG. 1 comprises, in the usual manner, a silicon chip 1 connected by connecting wires 2A, 2B, 2C, 2D, 2E to an array of metal connection areas 3A, 3B, 3C, 3D, 3E for making external electrical connections to the circuits contained in chip 1. In the example shown, a metal area 4 which is preferably coplanar with connection areas 3 provides an external thermal connection to chip 1, for the extraction of thermal energy generated by its operation.

The chip 1, connecting wires 2 and connection areas 3 are covered by a hardened resin 5 providing electrical insulation and immobilizing wires 2 and chip 1 relative to one another and relative to connection areas 3 and 4.

The side of each of connection areas 3 and 4 to be connected to connections (not shown) from external circuits (also not shown) is soldered to a conducting layer 6 of low melting point alloy covering a metal temporary substrate 7 which protects the connection areas against damage and contamination prior to utilization of the component. Melting alloy layer 6 permits temporary substrate 7 to be removed, which exposes the surfaces of connection areas 3 and 4 used for the external connections to the component.

The encapsulation method in accordance with the invention will now be described.

Firstly, a thin conductive layer 6 of low melting point alloy is deposited on a metal substrate 7 which is normally conductive.

The substrate may consist of any ordinary sheet metal, for example, and the alloy may be of the tin-lead type used for soldering and tinning metals on which it is deposited, for example. This alloy may be deposited by any suitable method, such as electrolytic deposition, for example, to a thickness sufficient to avoid the creation of a ternary alloy of the tin-lead-copper kind at the relatively high melting temperature experienced in the next stage, in which the metal connection areas are formed. A minimum thickness of the order of 10 to 30 microns should be selected, for example.

This first stage is not necessarily followed directly by the following stages, in that it is conceivable to use metal plates or a metal strip previously coated with low melting point alloy.

Figure 2:
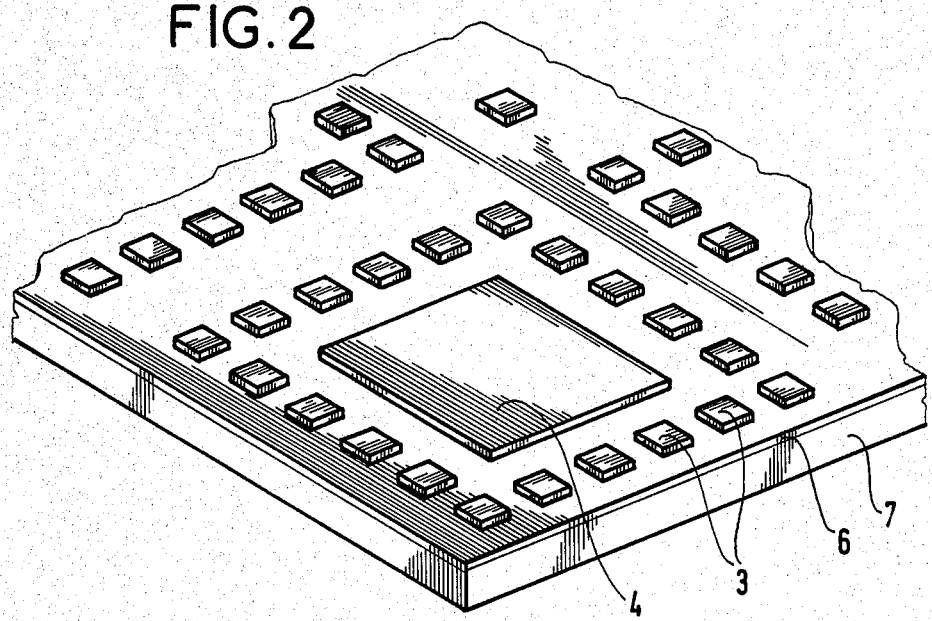
FIG. 2 is a view of the combination of a temporary substrate, alloy layer and metal layer corresponding to an intermediary stage in the component encapsulation method in accordance with the invention.

The second stage is to form the metal connection areas 3 and 4 as an array on the alloy layer 6 (FIG. 2).

There are a number of suitable methods for this, a first of which consists in the use of a metal film previously cut out to constitute the various connection areas 3 and 4 joined together by temporary links (not shown here) which are removed after soldering the connection areas to the alloy layer. This solution provides for a substantial reduction in the area occupied by the connection areas of a chip in that it is possible to benefit from these temporary links to resist the mechanical stresses during the soldering of connection areas 3 and 4 to alloy layer 6, the hardened resin encapsulating the final component subsequently withstanding such stresses.

In an alternative embodiment of the invention, the metal to form the connection array is deposited on the alloy layer 6 carried by substrate 7. The array may be formed, for example, by selective deposition through a mask of a metal such as copper or nickel, or by the selective removal of a uniform metal deposit, using photolithographic techniques, for instance. The result is a metal array preferably disposed in a regular pattern such as those shown in FIGS. 4 and 5, providing for the simultaneous and/or continuous manufacture of encapsulated components in accordance with the invention. The thickness and dimensions of the lands which constitute the various connection areas 3 and 4 and the distances between them are selected according to the usual electrical constraints and without reference to the mechanical constraints associated with the use of arrays formed from precut film, since the lands obtained are joined to temporary substrate 7 by the alloy layer which provided a base for their formation.

Thus it is possible to use conventional microelectronics techniques to form a connection array of minimum size for each chip 1 on temporary substrate 7 covered with alloy.

Figure 3:
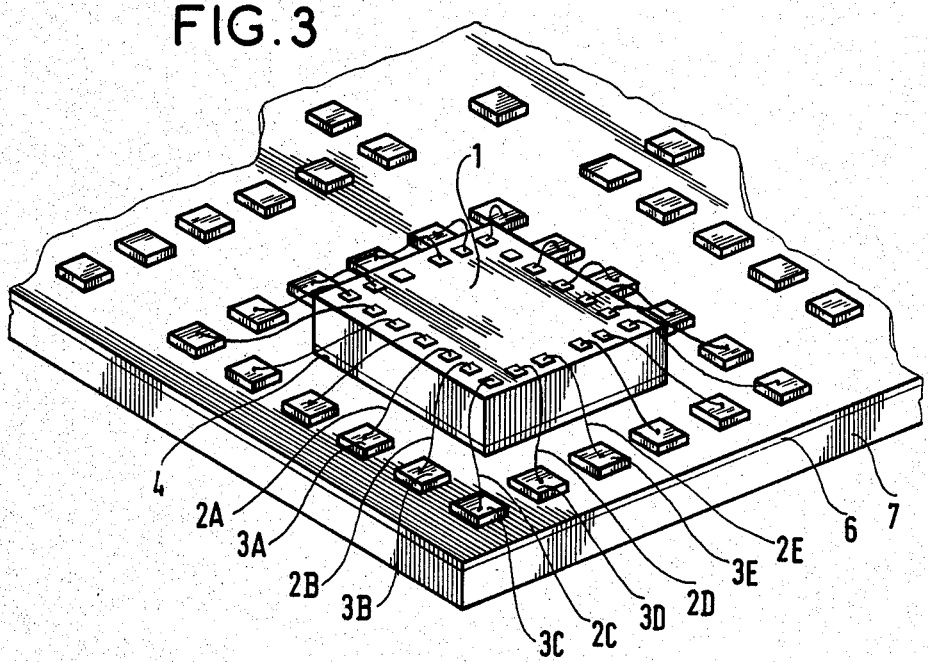
FIG. 3 is a general view corresponding to FIG. 2 and showing a chip mounted and connected in a susequent stage of the encapsulation method in accordance with the invention.

Chips 1 are then positioned on respective areas 4 and electrically connected to corresponding connection areas 3 by connecting wires 2, as for example in FIG. 3 where chip 1 on area 4 is connected to areas 3A, 3B, . . . by connection wires 2A, 2B, . . . . The equipment used for this purpose is that normally employed for positioning chips on an insulative substrate and connecting them to connection areas on the substrate.

Each component is encapsulated by molding or pouring a hardenable resin 5 to cover chip 1, connecting wires 2 and connection areas 3, again in the conventional manner. The hardening of this resin by cooling or polymerization solidly binds together the various parts 1, 2, 3 and 4 of each component.

After hardening resin 5, alloy layer 6 is melted, by heating it to a relatively low temperature, in order to remove temporary metal substrate 7, the purpose of which was to enable a metal connection array of small dimensions to be fabricated.

Temporary substrate 7 may be removed at the end of the component manufacturing process, or subsequently when the components are to be used. Its removal exposes the surfaces of connection areas 3 and 4 for making external electrical and/or thermal connections to the component.

Removing temporary substrate 7 immediately prior to utilization offers the advantage of protection against damage by impact or friction and contamination of the areas to which external connections will be made.

The melting of the alloy layer also leaves a film of tin-lead alloy on the exposed surfaces of the connection areas, so that the tinning operation normally required prior to soldering on the external connections is not required in this instance.

As will be appreciated from FIGS. 2 and 3, a plurality of components would normally be manufactured simultaneously, the metal connection array having a regular pattern, preferably of matrix form, in which the thermal diffusion lands 4, the dimensions of which correspond to those of chips 1, are surrounded by respective satellite connection areas 3. Each component is separated from the others after encapsulation with and hardening of the resin, by sawing or other cutting technique, and either before or after removal of the temporary substrate.

MODIFICATION

Figure 4:
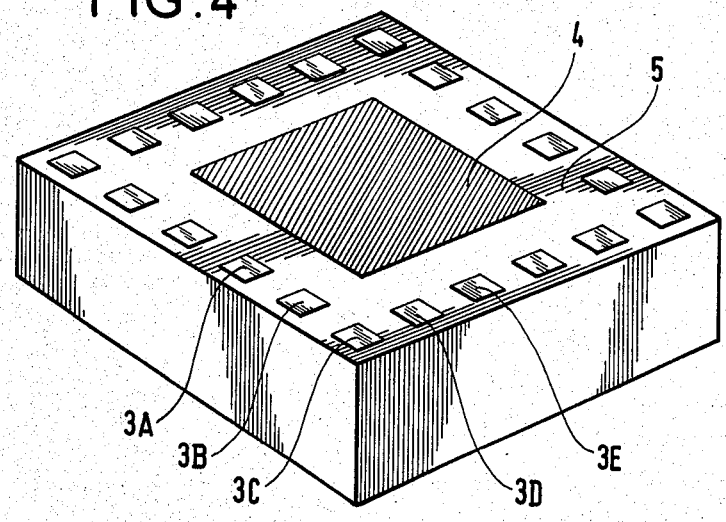
FIG. 4 is a bottom view of an encapsulated component in accordance with the invention.

FIG. 4 shows a single component of this kind with its connection areas 3 and 4 exposed.

Figure 5:
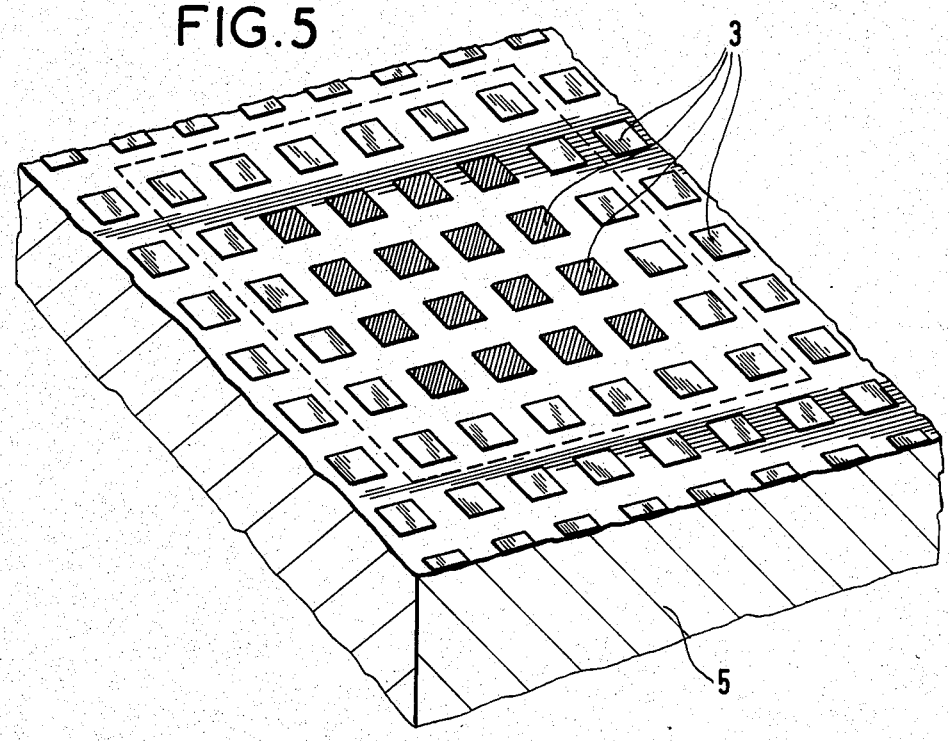
FIG. 5 is a botton view of an alternative embodiment of an encapsulated component in accordance with the invention.

In an alternative embodiment of the invention, the metal connection array is formed as a regular pattern consisting of identical lands disposed matrix fashion, as shown in FIG. 5. The thermal diffusion area under the chip then comprises a plurality of lands 3, shown shaded, identical to the electrical connection lands 3 surrounding them.

This means that the same pattern may be used for different components, which is of undoubted benefit where it is necessary to manufacture components in small quantities with different chips.

It will be understood that various changes in the details, materials and arrangements of parts, which have been herein described and illustrated in order to explain the nature of the invention, may be made by those skilled in the art within the principle and scope of the invention as expressed in the appended claims.

It is claimed:

1. A method of forming encapsulated semiconductor components comprising the steps of:
   depositing a conductive layer of low melting point alloy on a metal temporary substrate,
   depositing a metal array on said conductive layer of low melting point alloy to form connection areas to permit said components to be connected externally,
   placing each component chip in position on said metal array,
   electrically connecting each component chip to said connection area,
   immobilizing the components by molding or pouring a hardenable resin over each component consisting of a chip, its electrical connections and its connection areas, and
   hardening said resin, and
   melting the alloy layer to permit removal of the temporary substrate and expose the surface of the connection areas for permitting external electrical and/or thermal connections to be made to said encapsulated components.

2. A method according to claim 1, wherein said step of depositing said metal array on said conductive layer of low melting point alloy comprises cutting out said metal array from a metal film and soldering said metal array to the alloy layer by heating said alloy layer.

3. A method according to claim 1, wherein said step of depositing a metal array on said conductive layer of low melting point alloy comprises selectively depositing metal on said alloy layer.

4. A method according to claim 1, wherein said step of depositing said metal alloy metal array on a conductive layer of low melting point alloy comprises uniformly depositing metal on the alloy layer and then selectively removing parts of the metal deposit.

5. A method according to claim 1, wherein the connection areas are tinned prior to soldering the external connections by the melting of the alloy layer between the temporary substrate and the metal layer in order to remove said substrate.

6. A method of encapsulating semiconductor components including component chips, said method comprising the steps of:
 depositing a low melting point alloy layer on a metal temporary substrate,
 depositing metal on the alloy layer to form a connection array,
 fitting said chips to said deposited metal and wiring them to the connection areas of said connection array,
 molding or pouring a hardenable resin over each component consisting of a chip, its connecting wires and its connection areas,
 hardening the resin, and
 melting the alloy to separate the temporary substrate and the metal connection array to expose the surfaces of the connection areas for permitting external electrical and/or thermal connections to be made to the component whose surfaces are tinned by the molten alloy.

7. A method according to claim 6, wherein said step of depositing said metal layer comprises depositing a regular pattern providing a center area for thermal diffusion having dimensions corresponding to those of the chips to be applied thereto, and satellite connection areas surrounding the center area, and wherein the various areas of the pattern define a mechanical unity which can be separated by cutting after fitting the chip, connecting up the connecting wires and hardening the encapsulating resin.

8. A method according to claim 6, wherein the step of depositing said metal layer comprises depositing said metal layer in accordance with a regular pattern comprising a plurality of identical lands in a matrix arrangement to create a thermal diffusion area under each chip by means of number of lands on which the chip is located and wherein the connection of connecting wires is from the chip to lands surrounding the chip such that the resulting unit can be mechanically separated by cutting after fitting the chip, connecting up the connecting wires and hardening the encapsulating resin.

* * * * *